United States Patent [19]
Tutt et al.

[11] Patent Number: 6,031,556
[45] Date of Patent: *Feb. 29, 2000

[54] OVERCOAT FOR THERMAL IMAGING PROCESS

[75] Inventors: Lee William Tutt; Mitchell Stewart Burberry, both of Webster; Vito A DePalma; William Keith Goebel, both of Rochester; Scott Eric Tunney, Ontario, all of N.Y.

[73] Assignee: Eastman Kodak Company, Rochester, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/681,677

[22] Filed: Jul. 29, 1996

[51] Int. Cl.⁷ ...................................................... B41J 2/325
[52] U.S. Cl. .............................................. 347/212
[58] Field of Search .................................... 347/171, 212, 347/224; 399/342, 341; 503/227

[56] References Cited

U.S. PATENT DOCUMENTS

| | | | |
|---|---|---|---|
| 5,017,547 | 5/1991 | DeBoer | 503/227 |
| 5,045,888 | 9/1991 | Imaeda | 355/282 |
| 5,339,146 | 8/1994 | Aslam et al. | 355/285 |
| 5,529,884 | 6/1996 | Tutt et al. | 503/227 |

FOREIGN PATENT DOCUMENTS

| | | | |
|---|---|---|---|
| 720920 | 7/1996 | European Pat. Off. | |
| 3315139 | 11/1983 | Germany . | |
| 50/023826 | 6/1984 | Japan | 430/109 |
| 87/03249 | 6/1988 | WIPO . | |
| WO 9012342 | 10/1990 | WIPO . | |
| 91/08345 | 6/1992 | WIPO . | |

Primary Examiner—Huan Tran
Attorney, Agent, or Firm—Harold E. Cole

[57] ABSTRACT

A process of forming a single color image which has improved abrasion resistance comprising:

a) providing a thermal donor element comprising a heat-activatable image layer of a dye or pigment on a support, the image dye or pigment absorbing in the region of from about 300 to about 700 mn;

b) providing a receiving element in superposed relationship with the thermal donor element;

c) imagewise-exposing the thermal donor element by means of a laser or thermal head, thereby causing a change in the adhesion of at least a portion of the exposed areas of the heat-activatable layer to the receiving element or causing a portion of the exposed areas of the heat-activatable layer to diffuse into the receiver element;

d) separating the thermal donor element from the receiver element, thus creating an image layer on either or both of the elements;

e) charging either the thermal donor element or the receiver element containing the image layer to a given polarity or applying a voltage across the surface of the element which is attracted to a conductive surface behind the element;

f) applying colorless, charged particles to the element containing the image layer which causes them to be electrostatically attracted to the surface of the image layer; and g) heat-fusing the particles to obtain a protective overcoat over the entire surface of the image layer.

14 Claims, No Drawings

OVERCOAT FOR THERMAL IMAGING PROCESS

This invention relates to a process for applying a colorless, abrasion-resistant overcoat on an element obtained by a thermal imaging process.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to one of the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volalization only in those areas in which its presence is required on the receiver to reconstruct the color of the original object. Further details of this process are found in GB 2,083,726A, the disclosure of which is hereby incorporated by reference.

International Patent Application No. PCT/US87/03249, Publication No. WO 88/04237 relates to obtaining an image by a process known as "differential adhesion". A layer of material, such as carbon black, is deposited on a heat-activatable image-forming surface of a first sheet-like or web material, the layer having a cohesive strength greater than its adhesive strength to the first sheet-like element. Portions of this thermal imaging medium are then exposed to brief and intense radiation, such as by laser scanning, to fly attach exposed portions of the image-forming substance to the first sheet element. Finally, those portions of the image-forming substance not exposed to the radiation (and thus not firmly attached to the first sheet element) are removed, thus forming a binary image comprising a plurality of first areas, where the image-forming substance is adhered to the first sheet-like element, and a plurality of second areas, where the first sheet-like element is free from the image-forming substance.

In another disclosed embodiment in this International Application, the image-forming substance is covered with a second laminated sheet-like element so that the image-forming substance is confined between the first element and the second element. After imaging and separation of the unexposed portions of the image-forming substance (with the second element) from the first element, a pair of images is obtained.

This first image comprises exposed portions of image-forming substance more firmly attached to the first element by heat activation of the heat-activatable image-forming surface. A second image comprises non-exposed portions of the image-forming substance carried or transferred to the second sheet element. Further details of this process are described in the afore-mentioned International Patent Application No. PCT/US87/03249, Publication No. WO 88/04237, the disclosure of which is hereby incorporated by reference.

One way to improve abrasion resistance of an element is to use lamination. Lamination involves placing a durable and/or adhesive protective layer coated on a suitable support to the image which is to be protected. The support of the protective coating may remain permanently adhered or it may subsequently be peeled off leaving only the protective layer adhered to the image. Lamination has several disadvantages in that it brings about an added expense associated with coating an additional support. In addition, air pockets may be trapped during the laminating step leading to image defects. International Application No. PCTIUS91/08345 (published as WO 92/09930) relates to a lamination process for an element obtained by the differential adhesion process described above.

Electrostatic deposition of charged toner particles to a photoconductor carrying an oppositely charged image pattern, subsequent transfer of the toner image to a suitable receiver and heat fusing the toner particles to generate a final image is a well-known process in the electrophotographic art. In addition, charged, clear toners have been applied to electrostatically-generated images as disclosed in U.S. Pat. Nos. 5,339,146 and 5,045,888; and in Japanese Kokai 50/023826. However, these references do not disclose the use of such toners as a protective layer applied by a post-imaging step in a laser or thermal head imaging system.

It is an object of this invention to provide a process for producing an image by various thermal imaging processes which has improved scratch and abrasion resistance. It is another object of this invention to provide an overcoat layer on a thermal element which is applied after imaging, so that the overcoat layer covers the entire surface of the element, and which does not involve lamination.

These and other objects are achieved in accordance with the invention which relates to a process of forming a single color image which has improved abrasion resistance comprising:

a) providing a thermal donor element comprising a heat-activatable image layer of a dye or pigment on a support, the image dye or pigment absorbing in the region of from about 300 to about 700 nm;

b) providing a receiving element in superposed relationship with the thermal donor element;

c) imagewise-exposing the thermal donor element by means of a laser or thermal head, thereby causing a change in the adhesion of at least a portion of the exposed areas of the heat-activatable layer to the receiving element or causing a portion of the exposed areas of the heat-activatable layer to diffuse into the receiver element;

d) separating the thermal donor element from the receiver element, thus creating an image layer on either or both of the elements;

e) charging either the thermal donor element or the receiver element containing the image layer to a given polarity or applying a voltage across the surface of the element which is attracted to a conductive surface behind the element;

f) applying colorless, charged particles to the element containing the image layer which causes them to be electrostatically attracted to the surface of the image layer; and g) heat-fusing the particles to obtain a protective overcoat over the entire surface of the image layer.

In a preferred embodiment of the invention, the heat-activatable image layer has a cohesive strength greater than the adhesive strength between the heat-activatable image layer and the support of the thermal donor element. In another preferred embodiment, the heat-activatable image layer has a cohesive strength less than the adhesive strength between the heat-activatable image layer and the support of the receiver element in areas of image vise exposure. In another preferred embodiment, the heat-activatable image layer has a near infrared-absorbing material associated therewith to absorb at a given wavelength of a laser used to expose the element. In still yet another preferred embodiment, the heat-activatable image layer contains a wax and the thermal donor element is exposed by means of a thermal head.

The protective overcoat applied by the process of this invention improves the scratch-resistance and abrasion-resistance of the element. This is important, for example, in reprographic mask and printing mask applications where a scratch can remove fine line detail creating a defect in all subsequently exposed work. For purposes of this invention, monocolor refers to any single dye or pigment or mixture used to produce a single stimulus color. The resulting single-sheet medium can be used for creating medical images, reprographic masks, printing masks, etc., or it can be used in any application where a monocolored transmission sheet is desired. The image obtained can be positive or negative.

As noted above, after imaging, the recording element is either charged to a given polarity or a voltage is applied across the surface of the element which is attracted to a conductive surface behind the element. Charging the surface of the element may be accomplished, for example, by using a high voltage corona which charges the entire surface of the recording element. For example, a high voltage power supply can be connected to a wire suspended over the surface of the element, the surface layer being grounded. When the high voltage is applied, ions will be deposited on the surface of the element, the polarity of which is determined by the polarity of the voltage applied. This is well known in the electrophotographic art, as shown, for example, by U.S. Pat. Nos. 4,478,870; 4,423,951 and 4,041,312, the disclosures of which are hereby incorporated by reference.

Another method of attracting toner particles to the surface of the recording element is to use a technique called biased development. This method involves applying a voltage across the surface of the element which is attracted to a conductive surface, such as a metal surface, behind the element. This method creates a mechanism whereby particles will become attracted to the surface of the recording element.

The toner particles may be charged, for example, by agitating the toner particles with a magnetic carrier, such as ferrite particles, in a mixing chamber. The charge level and polarity of the toner can be adjusted by the addition of charge control agents to the toner or polymer coatings on the magnetic carrier. This can take place in a matter of several seconds up to a minute. This is well known in the electrophotographic art, as shown, for example, by U.S. Pat. No. 4,546,060, the disclosure of which is hereby incorporated by reference.

After the toner particles are mixed and charged, they are transported, usually by rotating magnets contained in a shell, to an offset roller. The particles are then attracted and then transferred to the recording element by electrostatic forces using one of the techniques described above.

After the colorless, oppositely-charged particles are applied to the surface of the element, the particles are heat- and/or pressure-fused to obtain a protective overcoat over the entire image. This can be accomplished by passing the recording element through a pair of heated rollers, heated to a temperature of, for example, 100° C. to about 200° C., using a pressure of about $6.9 \times 10^3$ to about $8.3 \times 10^4$ Pa (10–120 psi) at a transport rate of about 0.005 m/s to about 0.50 m/s. This is well known in the electrophotographic art, as shown, for example, by U.S. Pat. No. 3,961,863, the disclosure of which is hereby incorporated by reference.

Colorless toner particles, well-known in the electrophotographic art, may be used in the process of this invention. There can be used, for example, those materials disclosed in U.S. Pat. Nos. 5,339,146; 5,045,888; and in Japanese Kokai 50/023826, the disclosures of which are hereby incorporated by reference. Examples of such materials include resins which are generally colorless, or almost colorless and transparent, and whose softening point is in the range of from about 50 to about 150° C.

Examples of such particles include poly(vinyl chloride), poly(vinylidene chloride), poly(vinyl chloride-co-vinylidene chloride), chlorinated polypropylene, poly(vinyl chloride-co-vinyl acetate), poly(vinyl chloride-co-vinyl acetate-co-maleic anhydride), ethyl cellulose, nitrocellulose, poly(acrylic acid) esters, linseed oil-modified alkyd resins, rosin-modified allyd resins, phenol-modified alkyd resins, phenolic resins, polyesters, poly(vinyl butyral), polyisocyanate resins, polyurethanes, poly(vinyl acetate), polyamides, chroman resins, gum damar, ketone resins, maleic acid resins, vinyl polymers such as polystyrene and polyvinyltoluene or copolymers of vinyl polymers with methacrylates or acrylates, low-molecular weight polyethylene, phenol-modified pentaerythritol esters, poly(styrene-co-indene-co-acrylonitrile), poly(styrene-co-indene), poly(styrene-co-acrylonitrile), copolymers with siloxanes, polyalkenes and poly(styrene-co-butadiene), which may be used either alone or in combination. In a preferred embodiment of the invention, the colorless particles are made of either a polyester or poly(styrene-co-butyl acrylate).

To increase the abrasion resistance of the overcoat layer, polymers which are crosslinked or branched can be used. For example, there can be used, poly(styrene-co-indene-co-divinylbenzene), poly(styrene-co-acrylonitrile-co-divinylbenzene) or poly(styrene-co-butadiene-co-divinylbenzene).

In one embodiment of the invention, the heat-activatable image layer which can be employed is described in the International Patent Application No. PCT/US87/03249, Publication No. WO 88/04237, referred to above. In another embodiment, a so-called "wax-transfer" sheet can be employed as the heat-activatable image layer as described in U.S. Pat. Nos. 5,421,873 and 5,420,613, the disclosures of which are hereby incorporated by reference. In still another preferred embodiment, a conventional laser transfer system can be employed which utilizes as a heat-activatable image layer, a layer containing a dye, binder and infrared-absorbing material, as disclosed in U.S. Pat. No. 5,177,052, the disclosure of which is hereby incorporated by reference.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

In a preferred embodiment of the invention, the image dye or pigment in the recording element is substantially transparent in the near infrared region of the electromagnetic spectrum (700 to 100 nm) and absorbs in the region of from about 300 to about 700 nm and does not have substantial absorption at the wavelength of the laser used to expose the element. Generally, the image dye or pigment is a different material from the infrared-absorbing material used in the element to absorb the infrared radiation and provides visible and/or UV contrast at wavelengths other than the laser recording wavelengths. However, a pigment such as carbon could be used and would act as both the image pigment and near infrared-absorber. Thus, one material would perform two functions.

To obtain a laser-induced image using the process of the invention, a diode laser is preferably employed since it offers substantial advantages in terms of its small size, low cost, stability, reliability, ruggedness, and ease of modulation. In practice, before any laser can be used to heat a recording element, the element must contain an infrared-absorbing material, such as pigments like carbon black, or cyanine infrared-absorbing dyes as described in U.S. Pat. No. 4,973,572, or other materials as described in the following U.S. Pat. Nos.: 4,948,777; 4,950,640; 4,950,639; 4,948,776; 4,948,778; 4,942,141; 4,952,552; 5,036,040; and 4,912,083, the disclosures of which are hereby incorporated by reference. The laser radiation is then absorbed into the image layer containing a dye or pigment and converted to heat by a molecular process known as internal conversion. Thus, the construction of a useful image layer will depend not only on the hue, transferability and intensity of the dye or pigment, but also on the ability of the image layer to absorb the radiation and convert it to heat. The infrared-absorbing material or dye may be contained in the image layer itself or in a separate layer associated therewith, i.e., above or below the image layer.

Lasers which can be used in the invention are available commercially. There can be employed, for example, Laser Model SDL-2420-H2 from Spectra Diode Labs, or Laser Model SLD 304 V/W from Sony Corp.

Thermal printing heads can be used in certain embodiments of the invention to transfer dye or pigment from donor elements to receiving elements. There can be employed, for example, a Fujitsu Thermal Head (FTP-040 MCS001), a TDK Thermal Head F415 HH7-1089 or a Rohm Thermal Head KE 2008-F3.

Any image dye can be used in the recording element employed in the invention provided it has the characteristics described above. Especially good results have been obtained with dyes such as anthraquinone dyes, e.g., Sunikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine SR® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

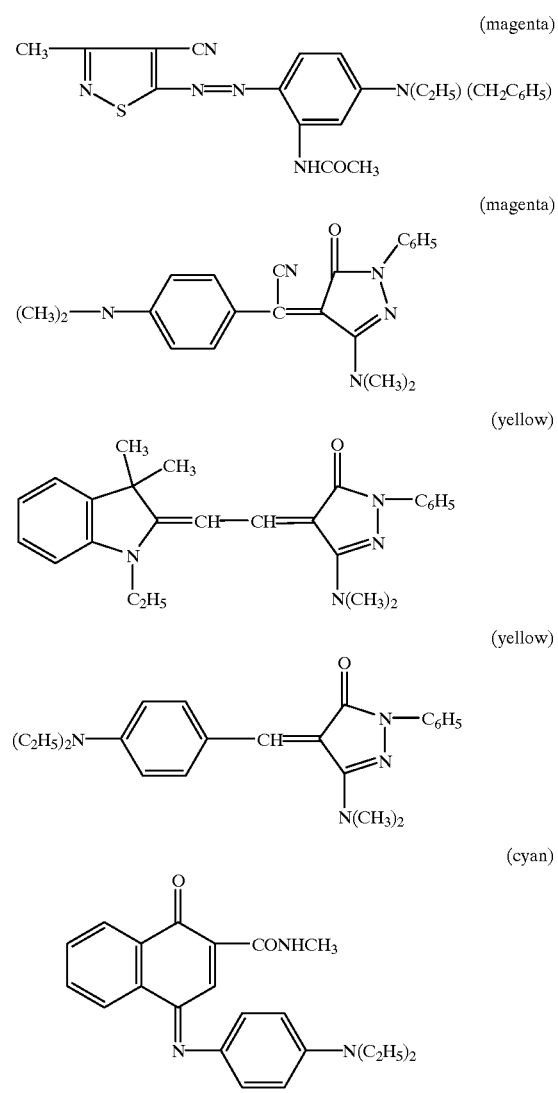

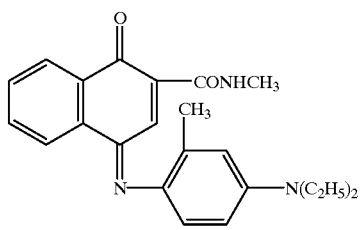
(cyan)

or any of the dyes disclosed in U.S. Pat. Nos. 4,541,830; 4,698,651; 4,695,287; 4,701,439; 4,757,046; 4,743,582; 4,769,360 and 4,753,922, the disclosures of which are hereby incorporated by reference. The above dyes may be employed singly or in combination. The dyes may be used at a coverage of from about 0.05 to about 1 g/m² and are preferably hydrophobic.

Pigments which can be used in the image layer include inorganic pigments such as carbon black or graphite. Examples of organic pigments which can be used in the invention include metal phthalocyanines such as copper phthalocyanine, quinacridones, epindolidiones, Rubine F6B (C.L No. Pigment 184); Cromophthal.RTM. Yellow 3G (C.I. No. Pigment Yellow 93); Hostaperm.RTM. Yellow 3G (C.I. No. Pigment Yellow 154); Monastral.RTM. Violet R (C.I. No. Pigment Violet 19); 2,9-dimethylquinacridone (C.L No. Pigment Red 122); Indofast.RTM. Brilliant Scarlet R6300 (C.L No. Pigment Red 123); Quindo Magenta RV 6803; Monstral.RTM. Blue G (C.I. No. Pigment Blue 15); Monstral.RTM. Blue BT 383D (C.I. No. Pigment Blue 15); Monstral.RTM. Blue G BT 284D (C.I. No. Pigment Blue 15); Monstral.RTM. Green GT 751D (C.I. No. Pigment Green 7) or any of the materials disclosed in U.S. Pat. Nos. 5,171,650 or 5,516,622, the disclosures of which are hereby incorporated by reference. Combinations of pigments and /or dyes can also be used. The pigments may be employed at a coverage of from about 0.05 to about 5 g/m².

The image layer of the recording element employed in the invention may be coated on the support or printed thereon by a printing technique such as a gravure process.

Any material can be used as the support for the recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 500 μm. In a preferred embodiment, the support is transparent.

The following examples are provided to illustrate the invention.

EXAMPLE 1

This example shows the electrostatic overcoat protection of a differential adhesion system utilizing a pigment.

A commercial imaging machine and film known as "Helios" manufactured by Polaroid Corp. was used to generate a test image in carbon. In this case, the image consisted of circles having uniform visible density of 1.9 o.d. as measured on an X-Rite densitometer Model 361T. The material was intercepted in the machine before application of the Polaroid lamination overcoat.

Electrostatic toning was accomplished by placing 800 g of polymer and magnetic carrier particles in a toner holder. The carrier consisted of particles of an iron strontium (6:1) ceramic material with a nominal size of 30–50 μm. The carrier transported the toner by means of rotating magnets in a shell to an offset roller. The imaged element was fed through the rollers with the coated side toward the offset roller at a speed of 8 cm/s. A bias of 1250V was applied to a backing roller to transfer approximately 5.38 g of particles per m² of element. No carrier was detectable on the film.

A clear polyester toner, Kao MO (KAO Inc., Racine Wis.) ground to an average size of 10 μm was employed and tested for its abrasion resistance and suitability as an image overcoat Fusing was accomplished by running the toned element through heated rollers at 121° C.

Results obtained with the above imaging system are shown in Table 1 below in a D-max area, since this is the area which is most sensitive to scratches and abrasions. (Dye cannot be removed in a Dmin area, since there is no dye in that area). Abrasion sensitivity was measured using a 50 cycle Taber abrasion test. The Taber test gently scratches the surface in a controlled manner using a pair of weighted abrasive disks. The degree of abrasion was quantified by examining the change in visible density.

Density measurements were made with an X-Rite Model 361T densitometer. Results are reported as percent loss of ortho density in the abraded region versus unabraded material. The following results were obtained:

TABLE 1

| | Ortho Density | | |
| Element | Original | After Abrasion Test | % Change |
| --- | --- | --- | --- |
| Element with no overcoat (control) | 1.9 | 1.65 | −13 |
| Element with polyester overcoat | 1.9 | 1.9 | 0 |

The above results show that the applied toner overcoat gave substantially better abrasion resistance of the resulting image than that obtained with the control which had no overcoat.

Optical micrographs were also obtained and show no image smear after fusing for the elements prepared according to the invention.

EXAMPLE 2

This example shows the electrostatic overcoat protection of a differential adhesion system utilizing a dye.

A 100 μm poly(ethylene terephthalate) support was coated with a subbing layer of about 0.0009 μm² of poly(acrylonitrile-co-vinylidene chloride-co-acrylic acid) (14:80:6) and the following dye layer:

| Material | g/m² |
| --- | --- |
| KGK | 0.337 |
| Pentaerythritol Triacrylate | 0.415 |
| Cyan Dye | 0.042 |
| Ethyl-4-dimethylaminobenzoate | 0.062 |
| Michler's Ketone | 0.070 |
| IR Dye | 0.042 |

KGK=The polymer prepared from 4,4'-(hexahydro-4,7-methanoinden-5-ylidene)bis(phenol) and phosgene.

Michler's ketone =4,4'-bis(dimethylamino)benzophenone

Cyan Dye:

IR Dye:

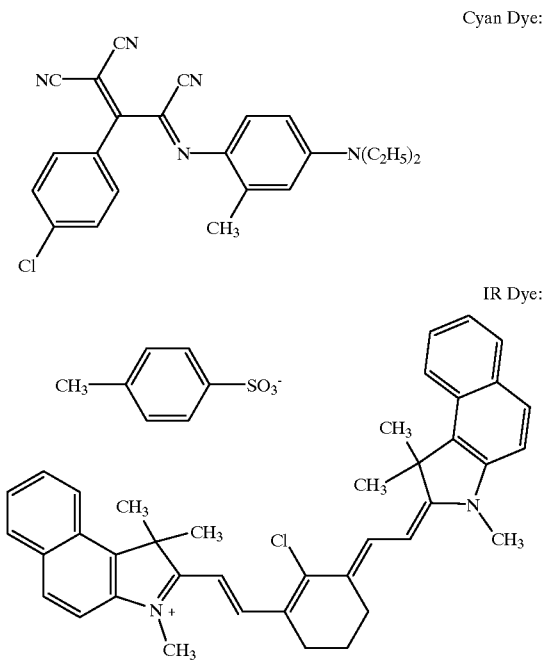

A receiver sheet of 100 μm poly(ethylene terephthalate) with the above subbing layer was placed such that the subbing side was against the dye coating of the above-prepared donor element. The composite was sent through a pair of rollers at room temperature while applying $2.07 \times 10^5$ Pa (30 psi) pressure. The rate of feed was approximately 0.02 m/sec.

The material was then written through the support side of the donor. The image was formed using an infrared laser exposing device of the type described in U.S. Pat. No. 5,168,288. The image step was carried out with the use of ten lasers which provide an average of 650 mw of power at the focal plane. The 53 cm drum of the printer assembly was rotated at speeds of 600 rev/min to 1100 to provide an energy input of 1.1 to 0.6 $J/cm^2$ respectively. Upon peeling, the written areas transferred while the unwritten areas remained on the donor sheet for all writing powers.

Electrostatic toning and fusing was accomplished as in Example 1 to transfer approximately 8.27 g of particles per $m^2$ on the donor and 7.38 g of particles per $m^2$ on the receiver. The Status A red density was measured with an X-Rite 820 densitometer and the Tabor test of Example 1 was used to obtain the following data:

TABLE 2

| | Status A Red Density | | |
|---|---|---|---|
| | | After Abrasion | |
| Element | Original | Test | % Change |
| Donor with no overcoat (control) | 0.93 | 0.65 | −30% |
| Donor with overcoat | 0.50 | 0.73 | +46%* |
| Receiver with no overcoat (control) | 0.72 | 0.55 | −24% |
| Receiver with overcoat | 0.54 | 0.55 | +2%* |

*Density increased due to increased light scattering at the surface. No scratching of the image was noted.

The above results show that the applied toner overcoat gave substantially better abrasion resistance of the resulting image in both the donor and receiver element than that obtained with the control elements which had no overcoat.

EXAMPLE 3

This example shows the electrostatic overcoat protection of a laser transfer system utilizing a dye.

A cyan donor element as described in U.S. Pat. No. 5,177,052, commercially available as the Approval® Cyan Donor (Eastman Kodak Co.) was placed, dye side, against a paper receiver. The receiving element was prepared in the following manner: A 125 μm thick paper support (alpha-maple pulp) containing enough $TiO_2$ for opacity was coated on the back side with 25 $g/m^2$ of high density polyethylene. The front side was coated with 20 $g/m^2$ of high density polyethylene. The front side was then coated with 0.71 $g/m^2$ polyvinyl alcohol, 0.43 $g/m^2$ matte beads (34 μm diameter) of polymethyl-methacrylate, and 0.06 $g/m^2$ of Ionac ® PFAZ-322 crosslinker from Sybron Chemical Inc., Birmingham, N.J. A final top layer was applied of 6.32 $g/m^2$ of polyvinylbutyral, 0.02$g/m^2$ of beads of styrene cross-linked with divinylbenzene (90:10) (18 micron diameter), and 0.01 $g/m^2$ DC 1248 surfactant from Dow Corning, Midland, Mich.

A vacuum was applied to hold the sheets together and to a printing drum having a circumference of 52.94 cm. Eighteen infrared diode lasers (~830 nm) are imaged on the rear surface of the cyan donor element, providing 180 mw in a 23 micron spot with a spacing of 14.1 μm. The drum was rotated at a rate of 9.6 Hz (575 rev/min) yielding a fluence of 251 $mj/cm^2$. The laser spot was moved on a screw such that during each rotation the lasers had moved over exactly 18 spot widths to a new region. The lasers were individually modulated to create the image desired. The infrared heating transfers the cyan dye from the donor element to the receiver. When the donor element was removed from the receiver sheet, an image had been transferred consisting of stripes of cyan dye.

Electrostatic toning and fusing was accomplished as previously described in Example 1 to transfer approximately 5.17 g of particles per $m^2$. The Status A red density was measured with an X-Rite 820 densitometer and the Tabor test of Example 1 was used to obtain the following data:

TABLE 3

| | Status A Red Density | | |
|---|---|---|---|
| | | After Abrasion | |
| Element | Original | Test | % Change |
| Element with no overcoat (control) | 0.89 | 0.37 | −58% |
| Element with overcoat | 0.72 | 0.70 | −2% |

The above results show that the applied toner overcoat gave substantially better abrasion resistance of the resulting image than that obtained with the control which had no overcoat

EXAMPLE 4

This example shows the electrostatic overcoat protection of a thermal wax transfer system as described in U.S. Pat. Nos. 5,421,873 and 5,420,613.

A thermal wax image was printed on paper using a CalComp ColorMaster Plus® thermal wax printer. The donor was the ColorMaster Plus 4-Color Imaging Ribbon®, part number CRB+C4B, and the receiver was CalComp ColorMaster® Plus B-size paper, part number CPB+B. The image consisted of alternating cyan/white stripes.

Electrostatic toning and fusing was accomplished as previously described to transfer approximately 13.68 g of particles per m² to the sample.

Using the Tabor test, as previously described, the following data was obtained:

TABLE 4

| | Status A Red Density | | |
|---|---|---|---|
| Element | Original | After Abrasion Test | % Change |
| Element with no overcoat (control) | 1.54 | 0.65 | −58% |
| Element with overcoat | 1.08 | 1.06 | +2%* |

**Density increased due to increased light scattering of the toned surface.

The above results show that the applied toner overcoat gave substantially better abrasion resistance of the resulting image than that obtained with the control which had no overcoat.

The invention has been described in detail with particular reference to preferred embodiments thereof, but it will be understood that variations and modifications can be effected within the spirit and scope of the invention.

What is claimed is:

1. A process of forming a single color image which has improved abrasion resistance comprising:
    a) providing a thermal donor element comprising a heat-activatable image layer of a dye or pigment on a support;
    b) providing a receiving element in superposed relationship with said thermal donor element;
    c) imagewise exposing said thermal donor element by means of a laser or thermal head, thereby causing a change in the adhesion of at least a portion of the exposed areas of said heat-activatable layer to said receiving element;
    d) separating said thermal donor element from said receiver element, thus creating an image layer on at least one of said elements;
    e) charging one of said elements containing said image layer to a given polarity or applying a voltage across the surface of said element which is attracted to a conductive surface behind said element;
    f) applying colorless, charged particles to said element containing said image layer which causes them to be electrostatically attracted to the surface of said image layer; and
    g) heat-fusing said particles to obtain a protective overcoat over the entire surface of said image layer.

2. The process of claim 1 wherein said heat-activatable image layer has a cohesive strength greater than the adhesive strength between said heat-activatable image layer and said support of said thermal donor element.

3. The process of claim 2 wherein said heat-activatable image layer has a cohesive strength less than the adhesive strength between said heat-activatable image layer and said support of said receiver element in areas of imagewise exposure.

4. The process of claim 1 wherein said heat-activatable image layer has a near infrared-absorbing material associated therewith to absorb at a given wavelength of a laser used to expose said element.

5. The process of claim 4 wherein said infrared-absorbing material is carbon which is contained in said heat-activatable image layer.

6. The process of claim 1 wherein said heat-activatable image layer contains a wax and said thermal donor element is exposed by means of a thermal head.

7. The process of claim 1 wherein said thermal donor support is transparent.

8. The process of claim 1 wherein said receiving element is transparent.

9. The process of claim 1 wherein said receiving element is paper.

10. The process of claim 1 wherein said heat-activatable image layer contains a dye.

11. The process of claim 1 wherein said heat-activatable image layer contains a pigment.

12. The process of claim 1 wherein said colorless particles comprise a polyester.

13. The process of claim 1 wherein step e) is performed by applying a voltage across the surface of said element which is attracted to a metal surface behind said element.

14. The process of claim 1 wherein said heat-fusing in step g) is accomplished using heated rollers.

* * * * *